United States Patent
Fukazawa et al.

[11] Patent Number: 5,744,402
[45] Date of Patent: Apr. 28, 1998

[54] METHOD OF MANUFACTURING SEMICONDUCTOR DEVICES

[75] Inventors: Yuji Fukazawa, Yokohama; Kazuhiko Takase, Kawasaki, both of Japan

[73] Assignee: Kabushiki Kaisha Toshiba, Kawasaki, Japan

[21] Appl. No.: 564,741

[22] Filed: Nov. 29, 1995

[30] Foreign Application Priority Data

Nov. 30, 1994 [JP] Japan ................... 6-296413

[51] Int. Cl.$^6$ ................... H01L 21/30; H01L 21/336
[52] U.S. Cl. ................... 438/734; 438/706; 438/710; 438/742; 438/743
[58] Field of Search ................... 437/228; 156/652.1, 156/653.1, 656.1, 657.1, 646.1; 438/706, 710, 734, 742, 743, 720, 723

[56] References Cited

U.S. PATENT DOCUMENTS

| | | | |
|---|---|---|---|
| 5,017,513 | 5/1991 | Takeuchi | 437/228 |
| 5,200,360 | 4/1993 | Bradbury et al. | 437/192 |
| 5,200,361 | 4/1993 | Onishi | 437/149 |
| 5,323,046 | 6/1994 | Ema et al. | 437/149 |

FOREIGN PATENT DOCUMENTS

| | | |
|---|---|---|
| 61-134015 | 6/1986 | Japan . |
| 63-102251 | 5/1988 | Japan . |
| 04123427 | 4/1992 | Japan . |
| 06216082 | 8/1994 | Japan . |

*Primary Examiner*—R. Bruce Breneman
*Assistant Examiner*—George Goudreau
*Attorney, Agent, or Firm*—Finnegan, Henderson, Farabow, Garrett & Dunner, L.L.P.

[57] ABSTRACT

In a method of removing a polymer and the leavings of the resist pattern that have adhered during dry etching to a film formed on a semiconductor substrate, the etched film undergoes plasma etching with the resist patter as a mask. Next, the resist pattern is removed by $O_2$ plasma ashing and then the surface of the substrate is washed with pure water. Thereafter, with the substrate heated to 40° C. or higher, the surface of the substrate is exposed to HF vapor and then the surface of the substrate is rinsed with pure water. With this method, the polymer and the leavings of the resist pattern that have adhered to the etched film can be removed easily.

23 Claims, 2 Drawing Sheets

METHOD OF MANUFACTURING SEMICONDUCTOR DEVICES

BACKGROUND OF THE INVENTION

1. Field of the Invention

This invention relates to a method of manufacturing semiconductor devices, and more particularly to a method of removing the leavings of dry etching when a resist pattern is used as a mask.

2. Description of the Related Art

Manufacturing semiconductor devices require various processes, one of which is dry etching. Dry etching, such as plasma etching or reactive ion etching (RIE), is indispensable for the formation of patterns.

A conventional dry etching process will be explained hereinafter using a case where an Al wiring layer is formed on a semiconductor substrate.

First, an Al film is formed on an insulating film on a semiconductor substrate. A resist pattern is formed on the Al film. With the resist pattern as a mask, the Al film selectively undergoes plasma etching to form an Al wiring pattern. A halogen series gas is used as etching gas. During etching, a polymer —a reaction product—adheres to the resist pattern and the sidewall of the Al wiring layer.

Then, the resist pattern is removed by $O_2$ plasma ashing. Because the resist pattern has been irradiated by plasma of a halogen series gas during the etching of the Al film, it is difficult to remove the pattern completely by the ashing process. Furthermore, in the ashing process, the polymer adhering to the resist pattern cannot be removed. To overcome this problem, after the $O_2$ plasma ashing, the surface is washed with an amine series organic solvent, thereby removing the polymer and the leavings of the resist pattern. Thereafter, to prevent the remaining amine series Cl or F from ionizing and corroding the Al wiring pattern, rinsing is effected using isopropyl alcohol (IPA). Furthermore, rinsing is done with pure water. Thereafter, an $SiO_2$ film that covers the Al wiring layer is formed.

As described above, after plasma etching has been done, the $O_2$ plasma ashing, the organic solvent process, the IPA rinse, and the pure water rinse are effected in that order. These processes are complicated and require a lot of time. In addition, because repeated use of the organic solvent reduces the capability of removing the leavings, the solvent must be changed frequently, resulting in the consumption of a large amount of organic solvent. Furthermore, since the organic solvent and IPA are undesirable substances in terms of environmental protection and safeguards, it is preferable to use them as little as possible.

Another problem is that there is a possibility that during $O_2$ plasma ashing, impurities, such as Na, will be implanted into the semiconductor substrate—the underlying layer, which will degrade the performance of the semiconductor device.

As described above, in the case of dry etching with the resist pattern as an etching mask, to completely remove the polymer generated in etching and the leavings of the resist after ashing, the complicated processes including the organic solvent process and IPA rinse process are needed.

SUMMARY OF THE INVENTION

It is, accordingly, an object of the present invention to overcome the disadvantages in the prior art by providing a method of removing a polymer and the leavings of the resist after dry etching.

The foregoing object is accomplished by providing a method of manufacturing semiconductor devices, comprising the steps of: forming a resist pattern on a first film provided on a semiconductor substrate; selectively dry-etching the first film with the resist pattern as a mask to form a pattern of the first film; removing the resist pattern by ashing; heating the semiconductor substrate to 40° C. or higher and exposing at least the surface of the first film pattern to HF vapor; and forming a second film on at least the first film pattern.

With the method of manufacturing semiconductor devices, the unwanted etching products (a polymer and the leavings of the resist pattern) adhering to the first film during etching can be removed without damaging the first film and the underlying film, by causing the products to react with the HF vapor. The first film may be made of silicon or one selected from these metals: Al, W, Ti, Mo, and Cu.

The first film may be made of an alloy containing silicon or one selected from these metals: Al, W, Ti, Mo, and Cu.;

The first film may be an insulating film.

The dry-etching step may be carried out using a halogen series gas.

The dry-etching step to the step of forming the second film may be carried out without contact with air.

Unwanted reaction products that have adhered to the surface of the first film pattern in the dry-etching step may be removed by the HF vapor in the step of exposing to HF vapor.

The step of forming the first film pattern may be a step of making a contact hole in the first film to a metal layer underlying the first film; and the step of exposing to the HF vapor may involve exposing to HF vapor the surface of an exposed portion of the underlying metal layer in the contact hole.

The step of forming the first film pattern may be to form a metal pattern of silicon or the selected one of the metals.

The step of forming the first film pattern may be to form an alloy pattern of an alloy containing silicon or the selected one of the metals.

The second film may be an insulating film.

The step of forming the second film may be the step of forming the insulating film on the metal pattern.

The step of forming the second film may be the step of forming an insulating film on the alloy pattern.

The second film may be made of silicon or one selected from these metals: Al, W, Ti, Mo, and Cu.

The second film may be made of an alloy containing silicon or one selected from these metals: Al, W, Ti, Mo, and Cu.

The second film may be made of silicon or one selected from these metals: Al, W, Ti, Mo, and Cu, and the step of forming the second film may be the step of forming a film of silicon or the selected metal on the first film and the inside of the contact hole.

The second film may be made of an alloy containing silicon or one selected from these metals: Al, W, Ti, Mo, and Cu, and the step of forming the second film may be the step of forming a film of the selected alloy on the first film and the inside of the contact hole.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

The outline of a method of manufacturing semiconductor devices will be described with reference to FIGS. 1A and 1B.

Figure 1A:
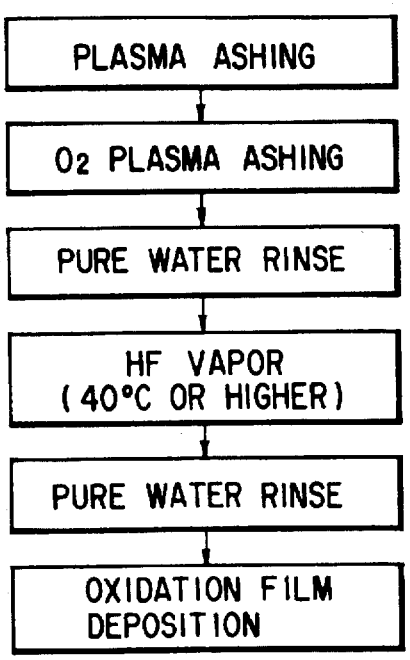
FIG. 1A is a flowchart for a method of manufacturing semiconductor devices according to the present invention.

As shown in FIG. 1A, with a resist pattern as a mask, a film to be etched on a semiconductor substrate is caused to undergo plasma etching. Next, the resist pattern is removed by $O_2$ plasma ashing and then the surface of the substrate is rinsed with pure water. Thereafter, the substrate is heated to 40° C. or higher and in this state, the surface of the substrate is exposed to HF vapor. Then, the surface of the substrate is rinsed with pure water. In the end, $SiO_2$ may be deposited on the surface of the substrate.

Figure 1B:
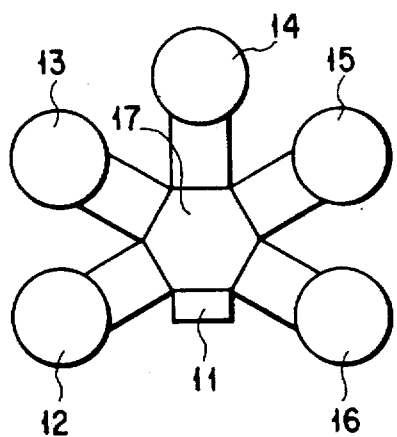
FIG. 1B shows a tool cluster.

FIG. 1B shows one of cluster tools that carry out such a method, which is composed of a load and unload stage 11, a plasma etching chamber 12, an $O_2$ plasma etching chamber 13, a pure water chamber 14, an HF vapor chamber 15, an $SiO_2$ deposition chamber 16, and a handler chamber 17.

Hereinafter, the method will be described concretely. Referring to FIGS. 2A to 2E, a first embodiment of the present invention will be described. In this embodiment, the present invention has been applied to the formation of an Al wiring pattern.

Figure 2A:
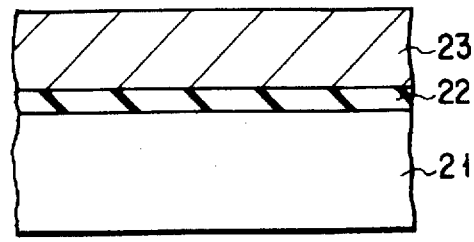
FIGS. 2A to 2E are sectional views of a semiconductor device in the individual steps in the manufacturing method according to a first embodiment of the present invention.
Figure 2B:
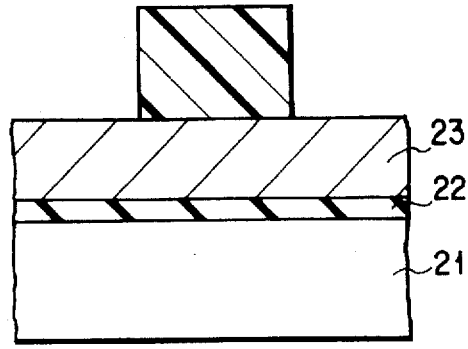

As shown in FIG. 2A, an Al film 23 is formed on, for example, an oxide film 22 on a semiconductor substrate 21. A resist is applied to the Al film 23. The resist layer is subjected to an exposure and development process to form a resist pattern as shown in FIG. 2B. With the resist pattern as a mask, the Al film 23 selectively undergoes plasma etching with a halogen series gas, such as chlorine gas.

Figure 2C:
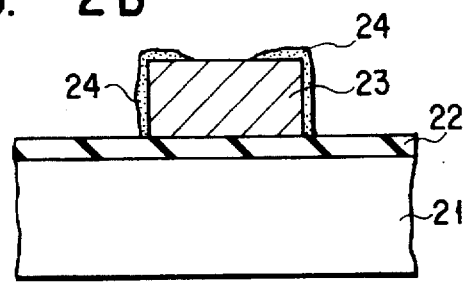

Then, the resist pattern is removed by $O_2$ plasma ashing to form an Al wiring pattern 23 as shown in FIG. 2C. In this stage, a polymer 24 and the leavings of the resist pattern, and halogen gas remain adhered to the top and sidewall of the Al wiring pattern 23.

Figure 2D:
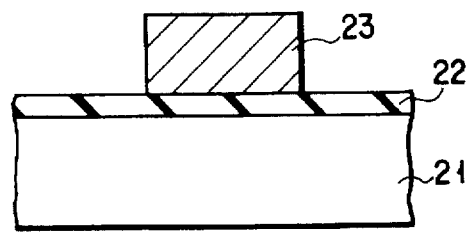
Figure 2E:
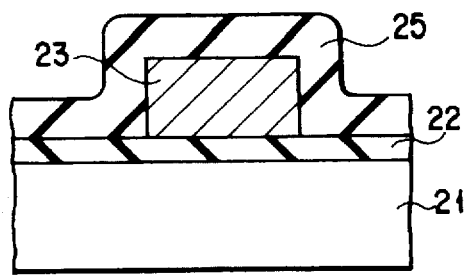

Thereafter, the surface of the Al wiring pattern 23 is rinsed with pure water. By doing this, the halogen gas that has adhered to the Al wiring pattern 23 is removed. Then, with the substrate heated to 40° C. or higher, HF vapor (vapor from azeotropic HF) is supplied to the surface of the substrate for about one minute and then the surface of the Al wiring pattern 23 is exposed to HF vapor. Thereafter, the surface of the Al wiring pattern 23 is rinsed with pure water and dried. As a result, as shown in FIG. 2D, the leavings of the resist pattern and the polymer 24 adherent to the Al pattern 23, are removed. At this time, since the substrate has been heated to 40° C. or higher, the HF vapor reacts with the polymer 24, not with the wiring pattern 23. Because a low heating temperature of the substrate permits the HF vapor to react with Al wiring pattern 23, corroding the Al wiring pattern 23, the substrate must be heated to 40° C. or higher. Thereafter, an oxide film 25 is formed on the surface of the substrate as a protective film for the Al wiring pattern 23 as shown in FIG. 2E.

With the above method, it is possible to form Al wiring free from foreign matter (e.g., polymer, leavings, or halogen gas), which leads to an improvement in the reliability of the semiconductor device. Furthermore, by carrying out the series of steps described above without allowing the substrate to be exposed to the air, it is possible to prevent ions (including, Cl, F, etc.) in the air from adhering in the individual steps, which further improves the reliability.

Hereinafter, a second embodiment of the present invention will be described with reference to FIGS. 3A to 3E. In this embodiment, a contact hole is formed to make contact between the underlying Al wiring pattern and the overlying Al wiring pattern. Only what is different from the first embodiment will be explained.

Figure 3A:
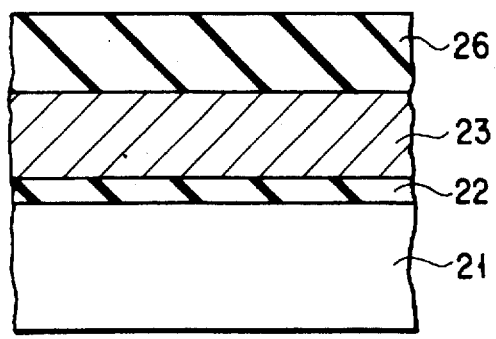
FIGS. 3A to 3E are sectional views of a semiconductor device in the individual steps in the manufacturing method according to a second embodiment of the present invention.
Figure 3B:
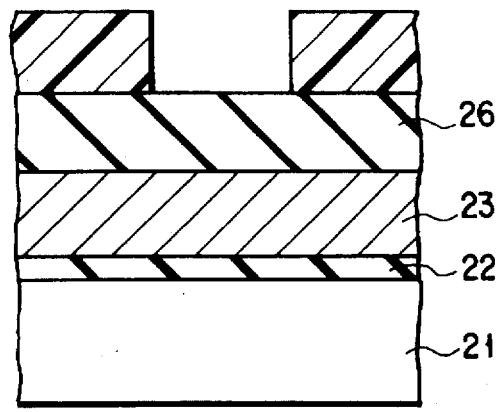
Figure 3C:
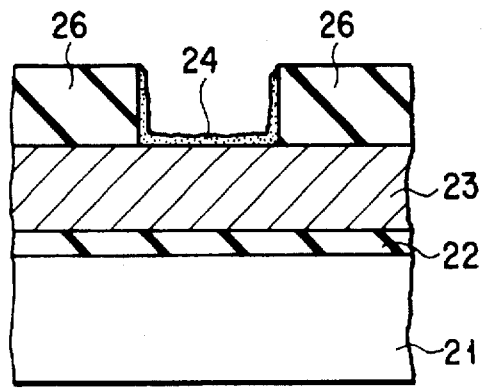

As shown in FIG. 3A, an insulating film 26 is formed over the entire surface of a semiconductor substrate 21 including an Al wiring pattern 23 on the substrate. On the insulating film, a resist pattern is formed as shown in FIG. 3B. With the resist pattern as a mask, the insulating film 26 selectively undergoes plasma etching to form a contact hole. A halogen series gas is used as etching gas. Thereafter, by $O_2$ plasma ashing, the resist pattern is removed. As shown in FIG. 3C, in this stage, a polymer 24, halogen gas, and the leavings of the resist pattern remain adhered to the sidewall of the insulating film 26 forming the contact hole and the exposed portion of the Al wiring pattern caused as a result of the formation of the contact hole.

Figure 3D:
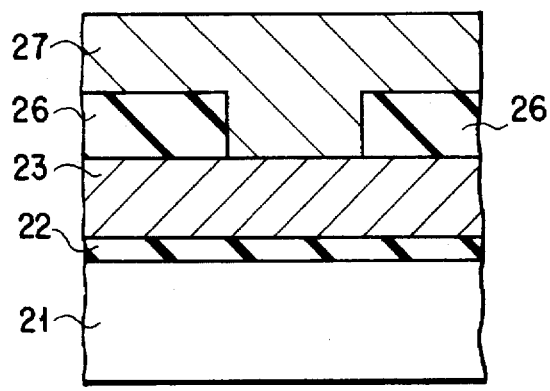
Figure 3E:
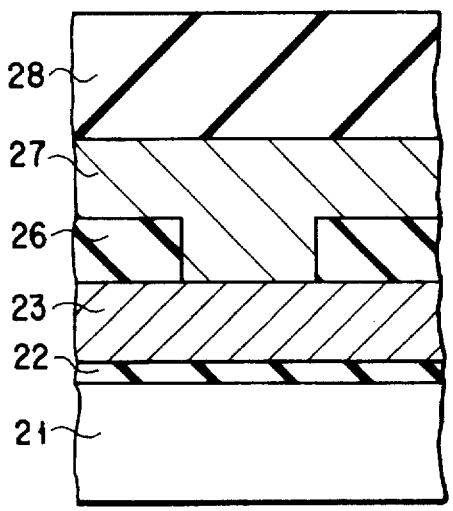

Then, the surface is washed with pure water to remove halogen gas. Thereafter, with the substrate heated to 40° C. or higher, HF vapor (vapor from azeotropic HF) is supplied to the surface of the substrate for about one minute to expose to HF vapor the surface of the insulating film 26 and the exposed portion of the Al wiring pattern 23. After this, the surface of the substrate is rinsed with pure water and dried. As a result, the polymer 24 and the leavings of the resist pattern that have adhered to the contact hole are removed. Thereafter, as shown in FIG. 3D, an Al film 27 is formed so as to fill the contact hole. Then, an oxide film 28 acting as an interlayer insulating film or protective film is formed over the Al film 27 as shown in FIG. 3E.

As described above, when a contact hole is made, a polymer and the leavings of the resist pattern adhere to the sidewall of the insulating film 26 in which a contact hole is made and the exposed portion of the Al wiring pattern caused by the formation of the contact hole. These deposits can be removed by HF vapor without damaging the Al wiring pattern 23 at the underlying layer.

While in the first and second embodiments, Al is used for the wiring pattern 23, a wiring pattern made of Ti, Cu, Mo, W, or Si or an alloy wiring pattern mainly made of silicon or either of these elements may be used.

The same holds true for the Al film 27. In addition to Al, the film may be a film made of Ti, Cu, Mo, W, or Si or an alloy film mainly made of silicon or either of these elements.

As described above, with the present invention, it is possible to easily remove a polymer and the leavings of the resist pattern that have adhered, during etching, to a film to be etched, without requiring complicated processes including an organic solvent process and an IPR rinse process. These deposits will cause corrosion. With the present invention, the deposits are removed by HF vapor, so that the reliability of the semiconductor device can be improved.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing semiconductor devices, comprising the steps of:
   forming a conductive film on a silicon oxide film provided on a semiconductor substrate;
   forming a resist pattern on the conductive film formed on the silicon oxide film;
   selectively dry-etching the conductive film with the resist pattern as a mask to form a pattern of the conductive film; and
   heating the semiconductor substrate to 40° C. or higher and exposing the conductive film pattern to HF vapor, to thereby remove reaction products adhered in the dry-etching step to an exposed surface portion of the pattern of the conductive film.

2. A method of manufacturing a semiconductor device according to claim 1, wherein the conductive film is made of silicon or one selected from these metals: Al, W, Ti, Mo, Cu, and Si.

3. A method of manufacturing semiconductor devices comprising the steps of:
   forming a resist pattern on a first film provided on a semiconductor substrate;
   selectively dry-etching the first film with the resist pattern as a mask to form a pattern of the first film;
   removing the resist pattern by ashing;
   heating the semiconductor substrate to 40° C. or higher and exposing at least the surface of the first film to HF vapor; and
   forming a second film on at least the first film pattern,
   wherein the first film is made of an alloy containing silicon or one selected from these metals: Al, W, Ti, Mo, and Cu.

4. A method of manufacturing semiconductor devices according to claim 2, wherein the step of forming the conductive film pattern is to form a pattern of silicon or the selected one of the metals.

5. A method of manufacturing semiconductor devices according to claim 3, wherein the step of forming the first film pattern is to form an alloy pattern of an alloy containing the selected one of the metals.

6. A method of manufacturing semiconductor devices comprising the steps of:
   forming a resist pattern on a first film made of silicon or one selected from the metals Al, W, Ti, Mo, and Cu, provided on a semiconductor substrate;
   selectively dry-etching the first film with the resist pattern as a mask to form a pattern of the first film;
   removing the resist pattern by ashing;
   heating the semiconductor substrate to 40° C. or higher and exposing at least the surface of the first film pattern to HF vapor; and
   forming a second film on at least the first film pattern to constitute an insulating film thereon.

7. A method of manufacturing semiconductor devices comprising the steps of:
   forming a resist pattern on a first film made of an alloy containing silicon or one selected from the metals Al, W, Ti, Mo, and Cu, provided on a semiconductor substrate;
   selectively dry-etching the first film with the resist pattern as a mask to form a pattern of the first film;
   removing the resist pattern by ashing;
   heating the semiconductor substrate to 40° C. or higher and exposing at least the surface of the first film pattern to HF vapor; and
   forming a second film on at least the first film pattern to constitute an insulating film thereon.

8. A method of manufacturing semiconductor devices, comprising the steps of:
   forming a first conductive film on a first silicon oxide film provided on a semiconductor substrate;
   forming a second silicon oxide film on the first conductive film;
   forming a resist pattern on the second silicon oxide film;
   selective dry-etching the second silicon oxide film with the resist pattern as a mask to form a contact hole in the second silicon oxide film leading to the first conductive film; and
   heating the semiconductor substrate to 40° C. or higher and exposing a surface portion of the first conductive film which is in the contact hole to HF vapor, to thereby remove reaction products adhered to the exposed surface portion of the first conductive film in the dry-etching step.

9. A method of manufacturing semiconductor devices according to claim 8, further comprising a step of removing the resist pattern prior to the heating step.

10. A method of manufacturing semiconductor devices according to claim 8, further comprising a step of removing the resist pattern after the heating step.

11. A method of manufacturing semiconductor devices according to claim 9, further comprising a step of forming a second conductive film on the first conductive film via the contact hole, after the heating step.

12. A method of manufacturing semiconductor devices according to claim 10, further comprising a step of forming a second conductive film on the first conductive film via the contact hole, after the removing step.

13. A method of manufacturing semiconductor devices according to claim 11, wherein the steps from the dry etching step to the second conductive film forming step are performed without contact with air.

14. A method of manufacturing semiconductor devices according to claim 12, wherein steps from the dry etching step to the second conductive film forming step are performed without contact with air.

15. A method of manufacturing semiconductor devices according to claim 8, wherein the first conductive film is made from an alloy containing silicon or one selected from these metals: Al, W, Ti, Mo, and Cu.

16. A method of manufacturing semiconductor devices according to claim 12, wherein the second conductive film is made of silicon or one selected from these metals: Al, W, Ti, Mo, and Cu.

17. A method of manufacturing semiconductor devices according to claim 12, wherein the second conductive film is made of an alloy containing silicon or one selected from these metals: Al, W, Ti, Mo, and Cu.

18. A method of manufacturing semiconductor devices according to claim 12, wherein the second conductive film is made from silicon or one selected from these metals: Al, W, Ti, Mo, and Cu, and the step of forming the second conductive film is the step of forming a film of silicon or the selected metal on the first conductive film and the inside of the contact hole.

19. A method of manufacturing semiconductor devices according to claim 12, wherein the second conductive film is made of an alloy containing silicon or one selected from these metals: Al, W, Ti, Mo, and Cu, and the step of forming the second conductive film is the step of forming a film of the selected alloy on the first conductive film and the outside of the contact hole.

20. A method of manufacturing semiconductor devices according to claim 11, wherein the second conductive film is made of silicon or one selected from these metals: Al, W, Ti, and Cu.

21. A method of manufacturing semiconductor devices according to claim 11, wherein the second conductive film is made of an alloy containing silicon or one selected from these metals: Al, W, Ti, Mo, and Cu.

22. A method of manufacturing semiconductor devices according to claim 11, wherein the second conductive film is made of silicon or one selected from these metals: Al, W, Ti, Mo, and Cu, and the step of forming the second conductive film is the step of forming a film of silicon or the selected metal on the first conductive film and the inside of the contact hole.

23. A method of manufacturing semiconductor devices according to claim 11, wherein the second conductive film is made of an alloy containing silicon or one selected from these metals: Al, W, Ti, Mo, and Cu, and the step of forming the second conductive film is the step of forming a film of the selected alloy on the first conductive film and the inside of the contact hole.

* * * * *